United States Patent
Fussinger et al.

(10) Patent No.: US 9,197,183 B2
(45) Date of Patent: Nov. 24, 2015

(54) METHOD OF FABRICATING A SINGLE-PIECE MICROMECHANICAL COMPONENT INCLUDING AT LEAST TWO DISTINCT FUNCTIONAL LEVELS

(71) Applicant: Nivarox-FAR S.A., Le Locle (CH)

(72) Inventors: Alexandre Fussinger, Wavre (CH); Marc Stranczl, Nyon (CH)

(73) Assignee: Nivarox-FAR S.A., Le Locle (CH)

( * ) Notice: Subject to any disclaimer, the term of this patent is extended or adjusted under 35 U.S.C. 154(b) by 129 days.

(21) Appl. No.: 14/176,322

(22) Filed: Feb. 10, 2014

(65) Prior Publication Data

US 2014/0226449 A1 Aug. 14, 2014

(30) Foreign Application Priority Data

Feb. 13, 2013 (EP) ..................................... 13155068

(51) Int. Cl.
*G04B 15/14* (2006.01)
*H03H 3/00* (2006.01)
*B81C 99/00* (2010.01)
*C23F 1/02* (2006.01)
*H03H 3/007* (2006.01)
*G03F 7/00* (2006.01)

(52) U.S. Cl.
CPC ............ *H03H 3/0072* (2013.01); *B81C 99/008* (2013.01); *G03F 7/00* (2013.01); *G04B 15/14* (2013.01); *B81B 2201/035* (2013.01); *G03F 7/0002* (2013.01); *Y10T 29/49002* (2015.01)

(58) Field of Classification Search
CPC ......... G04B 15/14; G03F 7/00; G03F 7/0002; B81C 99/008; B81B 2201/035; H03H 3/0072; Y10T 29/49002

USPC ................................................... 368/127, 129
See application file for complete search history.

(56) References Cited

U.S. PATENT DOCUMENTS

| | | | |
|---|---|---|---|
| 6,458,263 B1 | 10/2002 | Morales et al. | |
| 7,887,995 B2* | 2/2011 | Niwa et al. | 430/312 |
| 8,021,534 B2* | 9/2011 | Niwa et al. | 205/67 |
| 8,148,049 B2* | 4/2012 | Murayama et al. | 430/311 |
| 8,512,539 B2* | 8/2013 | Cusin et al. | 205/67 |
| 8,563,226 B2* | 10/2013 | Cusin et al. | 430/314 |
| 2006/0160027 A1* | 7/2006 | Niwa et al. | 430/312 |
| 2007/0227893 A1 | 10/2007 | Saucy | |

(Continued)

FOREIGN PATENT DOCUMENTS

| | | |
|---|---|---|
| CH | 699 416 A2 | 2/2010 |
| EP | 1 835 339 A1 | 9/2007 |

(Continued)

OTHER PUBLICATIONS

European Search Report issued Jul. 1, 2013 in European Application 13155068, filed on Feb. 13, 2013 (with English Translation).
Xiang-meng Jing et al. "Multi-layer microstructure fabrication by combining bulk silicon micromachining and UV-LIGA technology", Microelectronics Journal , vol. 38, No. 1, 2007, 5 pages.

*Primary Examiner* — Vit W Miska
(74) *Attorney, Agent, or Firm* — Oblon, McClelland, Maier & Neustadt, L.L.P.

(57) ABSTRACT

The invention relates to a method of fabricating a single-piece micromechanical component including at least two distinct functional levels. According to the invention, the method includes a LIGA process on a single level combined with the machining of the LIGA deposition directly on the substrate.

11 Claims, 5 Drawing Sheets

(56) References Cited

U.S. PATENT DOCUMENTS

| | | | |
|---|---|---|---|
| 2010/0308010 A1* | 12/2010 | Cusin et al. | 216/19 |
| 2011/0062112 A1 | 3/2011 | Saucy | |
| 2011/0203934 A1 | 8/2011 | Rey-Mermet | |
| 2011/0303546 A1 | 12/2011 | Saucy | |
| 2011/0310709 A1 | 12/2011 | Vaucher et al. | |
| 2012/0008468 A1 | 1/2012 | Bossart et al. | |
| 2012/0300596 A1* | 11/2012 | Koda et al. | 368/131 |

FOREIGN PATENT DOCUMENTS

| | | |
|---|---|---|
| EP | 2 182 096 A1 | 5/2010 |
| EP | 2 400 351 A1 | 12/2011 |
| EP | 2 407 831 A1 | 1/2012 |

* cited by examiner

METHOD OF FABRICATING A SINGLE-PIECE MICROMECHANICAL COMPONENT INCLUDING AT LEAST TWO DISTINCT FUNCTIONAL LEVELS

This application claims priority from European patent application No. 13155068.3 filed Feb. 13, 2013, the entire disclosure of which is hereby incorporated herein by reference.

FIELD OF THE INVENTION

The invention relates to a method of fabricating a single-piece micromechanical component including at least two distinct functional levels.

BACKGROUND OF THE INVENTION

It is known to form metal components having several distinct functional levels using successive LIGA type processes, i.e. from stacked layers including a structured resin mould and a metal in the hollows of the mould deposited by galvanoplasty.

However, these successive processes for forming several functional levels are difficult to implement since it is necessary to reference the functional levels properly in relation to each other. Moreover, it has become clear that this difficult involves much higher costs compared to two galvanic depositions on a single level.

SUMMARY OF THE INVENTION

It is an object of the present invention to overcome all of part of the aforecited drawbacks by proposing an alternative method of fabricating a single-piece micromechanical component including at least two distinct functional levels, which is less expensive to implement.

The invention therefore relates to a method of fabricating a single-piece micromechanical component including at least two distinct functional levels, characterized in that it includes the following steps:
 a) forming a silicon substrate whose top surface is electrically conductive;
 b) structuring a mould from a photosensitive resin in order to form cavities whose base is formed by said electrically conductive top surface;
 c) filling the cavities of the mould by galvanoplasty to form a metal part;
 d) selectively machining one portion of the metal part to form a single-piece micromechanical component having at least two distinct functional levels;
 e) releasing the micromechanical component from the substrate and the photosensitive resin.

It is clear that, advantageously according to the invention, each single-piece micromechanical component having at least two distinct functional levels is formed from a metal part in a unique pattern formed by a LIGA process which is then machined directly on the substrate so as to take advantage of the precise positioning of each metal part on the substrate.

Consequently, the external and possibly internal dimensions retain the high precision resulting from the LIGA process and the remainder of the single-piece micromechanical component enjoys less advantageous machining precision than the LIGA process, so as to conserve fabricating costs. There is thus obtained a single-piece micromechanical component including at least two distinct functional levels which is much less difficult to fabricate yet maintains very high precision external and possibly internal parts.

In accordance with other advantageous features of the invention:
 the top surface is rendered electrically conductive by doping the silicon substrate and/or by the deposition of an electrically conductive layer on the silicon substrate;
 the silicon substrate has a thickness of between 0.3 and 1 mm;
 step b) includes phase f): depositing a photosensitive resin layer on the electrically conductive top surface of the substrate, step g): selectively illuminating one portion of the photosensitive resin and step h): developing the photosensitive resin to structure the mould;
 the metal part is formed from a nickel-phosphorus base, such as NiP or NiP12;
 between step c) and step d), the method further includes step i): levelling the mould and the metal part by lapping;
 in step e), the method includes phases j): removing the photosensitive resin and k): removing the substrate;
 between phase j) and phase k), the method further includes phase l): depositing a coating over the micromechanical component—substrate assembly;
 phase l) is achieved by physical or chemical vapour deposition or by galvanoplasty;
 several micromechanical components are formed on the same substrate.

Moreover, the invention relates to a timepiece, characterized in that it includes at least one single-piece micromechanical component having at least two distinct functional levels obtained according to any of the preceding variants.

BRIEF DESCRIPTION OF THE DRAWINGS

Other features and advantages will appear clearly from the following description, given by way of non-limiting illustration, with reference to the annexed drawings, in which.

DETAILED DESCRIPTION OF PREFERRED EMBODIMENTS

It is an object of the present invention to propose a method of fabricating a single-piece micromechanical component including at least two distinct functional levels which is less expensive to implement. It is also an object of the present invention to fabricate all or part of a micromechanical component from this method. The micromechanical component is preferably intended to be mounted in a timepiece. Of course, it is also possible to envisage applying the present invention within other fields, such as, notably, aeronautics or the automobile industry.

Figure 17:
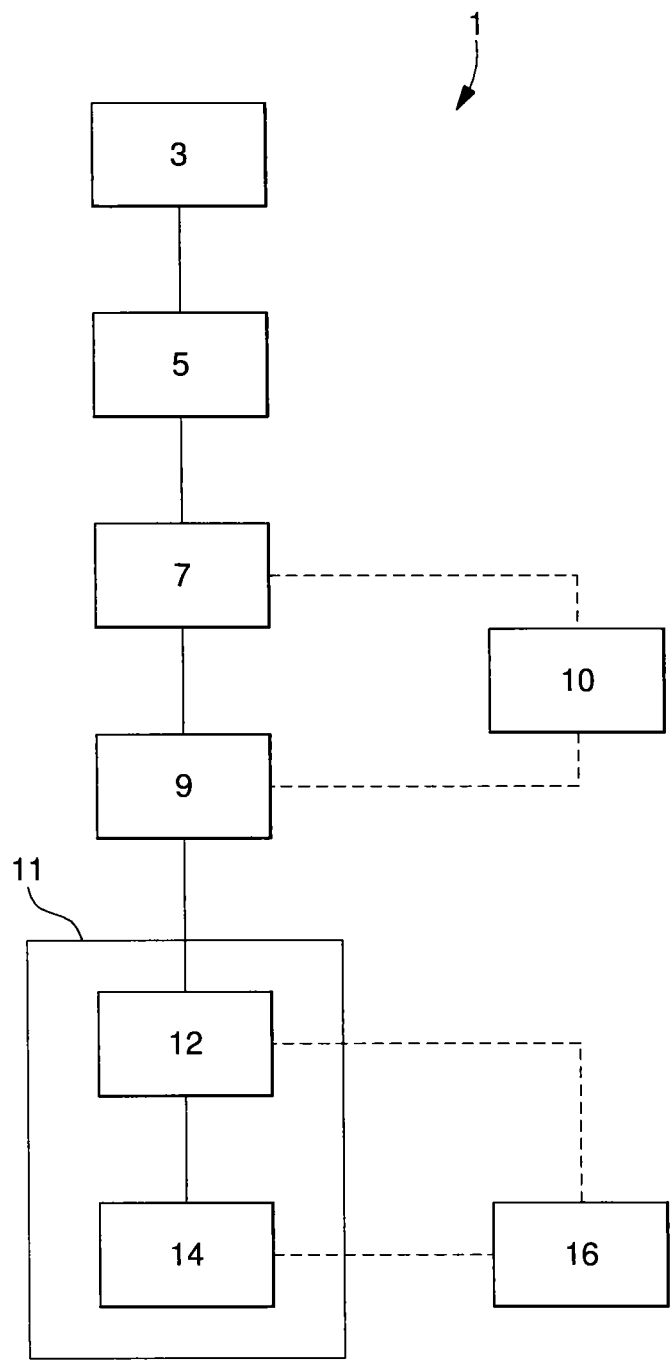
FIG. 17 is a block diagram of a method according to the invention.

As illustrated in FIG. 17, the invention relates to a method 1 of fabricating a single-piece micromechanical component 31, 41, 61, 91 having at least two functional levels.

Figure 1:
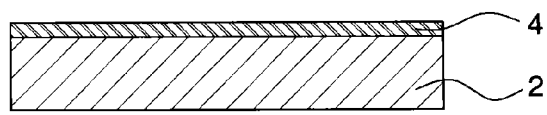
FIGS. 1 to 5 are diagrams of successive steps of a method according to a first embodiment of the invention.

According to method 1, a first step 3, as illustrated in FIG. 1, is intended to form a silicon substrate 2 whose top surface 4 is electrically conductive. Preferably, top surface 4 is rendered electrically conductive by doping silicon substrate 2 and/or by the deposition of an electrically conductive layer on silicon substrate 2.

In any event, it is very important that the subsequent galvanic deposition adheres as strongly as possible to substrate 2. Indeed, it is crucial for step 9 that metal part 21, 51, 81 is very strongly secured to top surface 4 and, incidentally, to substrate 2.

Preferably according to the invention, silicon substrate 2 has a thickness of between 0.3 and 1 mm. Moreover, if an electrically conductive layer is used, the layer will preferably be gold-based, i.e. made of pure gold or an alloy thereof. Finally, the layer could, for example, be deposited by physical or chemical vapour deposition or any other deposition method.

Figure 2:
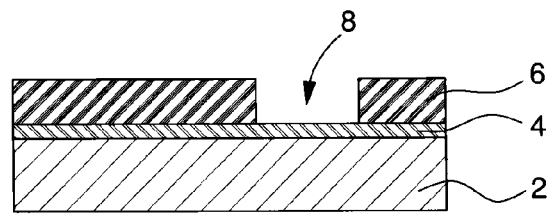

Method 1 continues, as illustrated in FIG. 2, with a second step 5 intended to structure a mould from a photosensitive resin 6 in order to form cavities 8, whose base is formed by the electrically conductive top face 4 of substrate 2.

Evidently, FIG. 2 is merely a simplified diagram and it is possible to structure very complex shapes. Thus, several cavities 8, not necessarily having identical shapes, may be structured in resin 6 in step 5 so that several micromechanical components 31, 41, 61, 91 can be formed on the same substrate 2.

Step 5 preferably includes three phases. Step 5 includes a first phase of depositing a photosensitive resin layer 6 on the electrically conductive top surface 4 of substrate 2. This phase may be obtained by spin coating or ultrasonic spraying. The second phase is intended to selectively illuminate one portion of the photosensitive resin. It is thus clear that, depending on the nature of the photosensitive resin, i.e. whether the resin is positive or negative, the illumination will be focussed on the required future cavities 8 or on portions other than the required future cavities 8.

Finally, step 5 ends with a third phase of developing the selectively illuminated photosensitive resin 6 in order to structure the mould, i.e. to harden the remaining photosensitive resin 6 between cavities 8. This third phase is generally obtained by a chemical etch intended to form cavities 8 followed by a heat treatment for hardening any resin still present.

Figure 3:
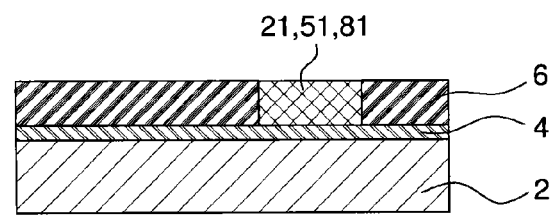

Method 1 continues, as illustrated in FIG. 3, with a third step 7 intended to fill cavities 8 of the mould by galvanoplasty to form a metal part 21, 51, 81. As explained above, metal part 21, 51, 81 has the same pattern in projection. It is therefore clear that the LIGA process does not have any additional implementation difficulties such as, for example, other functional patterns on higher levels.

Advantageously according to the invention, as a result of the very precise photolithography of step 5, method 1 can produce a metal part 21, 51, 81 with high precision external and possibly internal dimensions able to observe the very high tolerances required for a micromechanical component within the field of horology. "Internal dimensions" means that openings and/or holes in metal part 21, 51, 81 can be directly formed in step 7 from any parts of structured resin 6 which are inserted into cavities 8.

In order to implement the method of fabricating micromechanical components 31, 41, 61, 91 for watchmaking, it is preferable to use a material which is tribologically advantageous for any contact with ruby, steel or brass parts. Further, low sensitivity to magnetic fields is required. Finally, in order to facilitate step 9, it is also preferable for the material not to be too hard. Thus, given the above constraints, it was found particularly suitable to fill cavities 8 in step 7 with an alloy formed of nickel and phosphorus (NiP) and particularly an alloy of this type having a phosphorus proportion substantially equal to 12% (NiP12).

Figure 4:
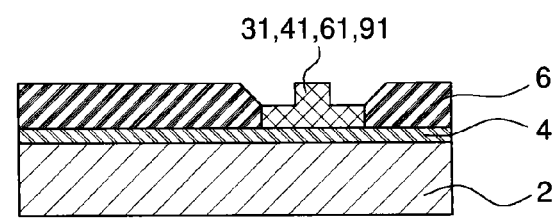

Method 1 continues, as illustrated in FIG. 4, with a step 9 of selectively machining one portion of metal part 21, 51, 81 to form a micromechanical component 31, 41, 61, 91 having at least two distinct functional levels. As explained above, the thickness of metal part 21, 51, 81, which has the same profile in projection, is then modified to form at least two functional patterns on several levels. The required micromechanical component 31, 41, 61, 91 is thus obtained without having to form several stacked functional levels from successive LIGA processes.

The importance of the strong adherence of each metal part 21, 51, 81 to the top surface 4 of substrate 2 is therefore clear. Indeed, during the machining in step 9, each metal part 21, 51, 81 will undergo high stresses. Hence, if the adherence is insufficient, method 1 loses the advantage of the precise positioning of each metal part 21, 51, 81 on substrate 2, or may even shear metal parts 21, 51, 81 to the point of detaching them from substrate 2.

Conversely, with strong adherence, because of the precise positioning of each metal part 21, 51, 81 on substrate 2, it is possible, in step 9, to machine each metal part 21, 51, 81 still on substrate 2, with an automated machine which can be programmed with precise dimensions. It is to be noted that, although step 9 is intended to machine each metal part 21, 51, 81, part of structured resin 6 may however also be machined by the stresses resulting from the tools used or the volumes to be removed, as illustrated by the clear spaces visible in FIG. 4.

Figure 5:
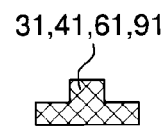

Finally, method 1 finishes, as illustrated in FIG. 5, with step 11 of releasing micromechanical component 31, 41, 61, 91 from substrate 2 and from photosensitive resin 6. Thus, in a first phase 12, step 11 is intended to remove photosensitive resin 6 and then in a second phase 14 to remove substrate 2. Phase 12 may be obtained, for example, by plasma etching, whereas phase 14 is preferably obtained by chemical etching. In a preferred manner, where an electrically conductive layer is used to form electrically conductive top surface 4, this layer will also be removed in phase 14 and possibly recovered by selective chemical etching.

Of course, the present invention is not limited to the illustrated example but is capable of various variants and alterations that will appear to those skilled in the art. In particular, method 1 may include an optional step 10, between step 7 and step 9, for levelling the mould formed of photosensitive resin 6 and metal part 21, 51, 81, by lapping. This optional step may be required to guarantee the dimensions of micromechanical component 31, 41, 61, 91, i.e. to ensure that the mould is completely filled.

Figure 6:
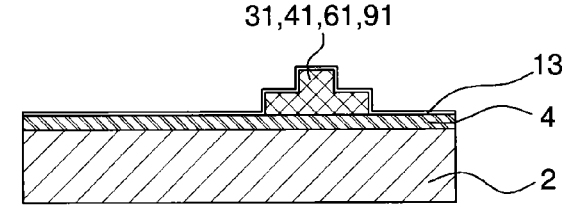
FIGS. 6 and 7 are diagrams of final steps of a method according to a second embodiment of the invention.

It is also possible to envisage taking advantage of the presence of several metal parts 21, 51, 81 on the same substrate 2 to coat them with a predetermined layer. Thus, method 1 may, as illustrated in FIG. 6, include an optional phase 16, between phase 12 and phase 14, for depositing a coating 13 on the micromechanical component 31, 41, 61, 91—substrate 2 assembly. This phase 16 may be obtained, for example, by a physical or chemical vapour deposition, electroforming or any other type of deposition.

Figure 7:

At the end of phase 14, there is thus obtained a micromechanical component 31, 41, 61, 91 partially coated with a layer 13, as illustrated in FIG. 7. Preferably, layer 13 is intended to improve the tribology of micromechanical component 31, 41, 61, 91, for example formed from a carbon allotrope such as graphene or diamond like carbon. However, layer 13 may also be used for another function such as changing the colour or hardness of micromechanical component 31, 41, 61, 91.

Figure 8:
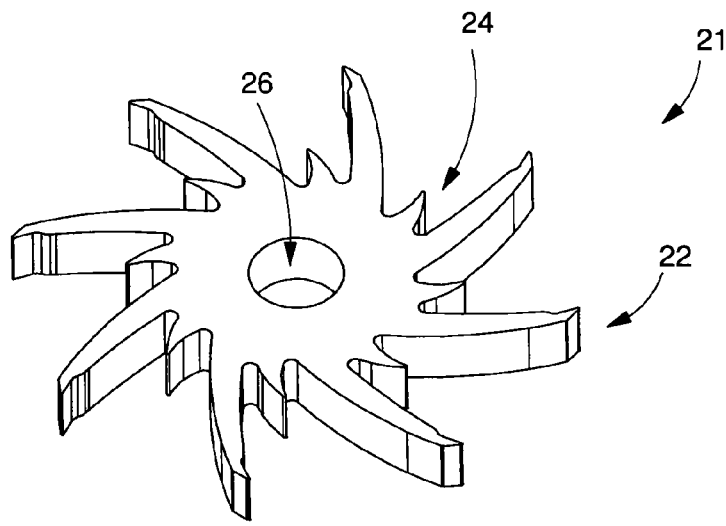
FIGS. 8 to 10 are diagrams of a metal part which is electroformed and then machined using a method according to a first variant of the invention.
Figure 9:
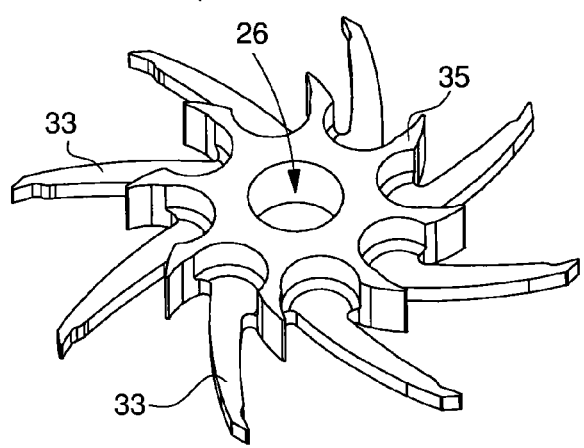
Figure 10:
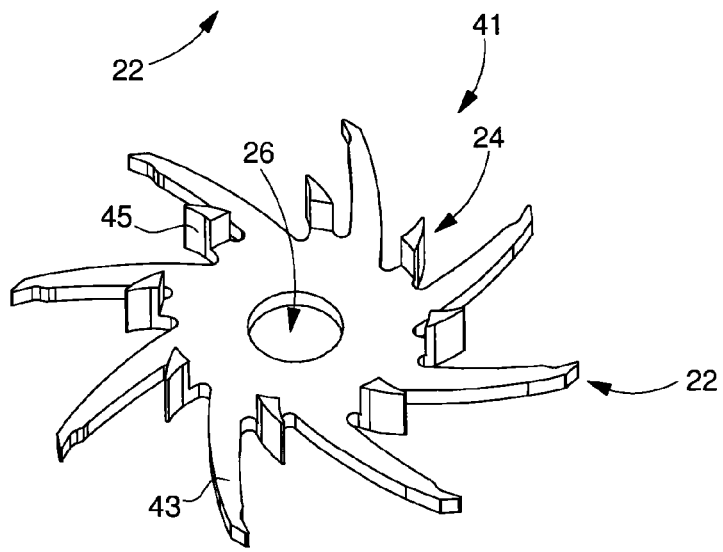

Example timepiece applications are presented in three variants illustrated in FIGS. 8 to 16. A first variant illustrated in FIGS. 8 to 10 shows a metal part 21 obtained in step 7 of method 1. The part generally takes the form of a star with double toothings 22, 24 including a central hole 26. At the end of step 11 of method 1, it is thus possible to obtain a micromechanical component in the form of an escape wheel 31 illustrated in FIG. 9, or an escape wheel 41 illustrated in FIG. 10, both of which are in a single-piece and include at least two distinct functional levels which may or may not be coated with a layer 13.

Thus, in the case of FIG. 9, the eight arms 33 of metal part 21 have been machined with the end of each arm forming toothing 22 in a lower level. The rest of metal part 21 remains unchanged, notably hole 26 and the eight arms 35, each end of which forms second toothing 24 in the lower level and in a higher level.

Alternatively, in the case of FIG. 10, the eight arms 43 of metal part 21 have been machined with the end of each arm forming toothing 22 in a lower level. Likewise, the area around hole 26 has been machined so that hole 26 is only present in the lower level. Finally, the eight arms 45 and one portion of the higher level have been machined so that only the ends of arms 45 remain while keeping the second toothing 24 in the lower level and in the upper level.

Figure 11:
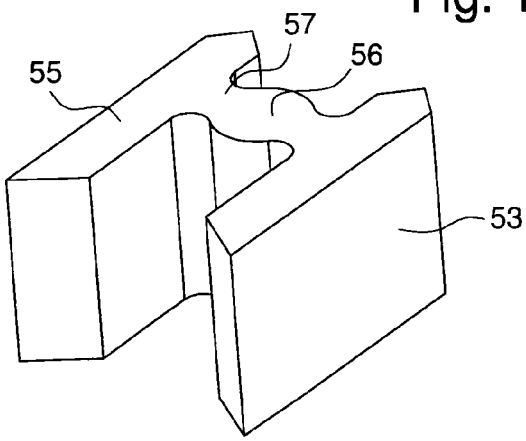
FIGS. 11 to 13 are diagrams of a metal part which is electroformed, then machined using a method according to a second variant of the invention, and then assembled.
Figure 12:
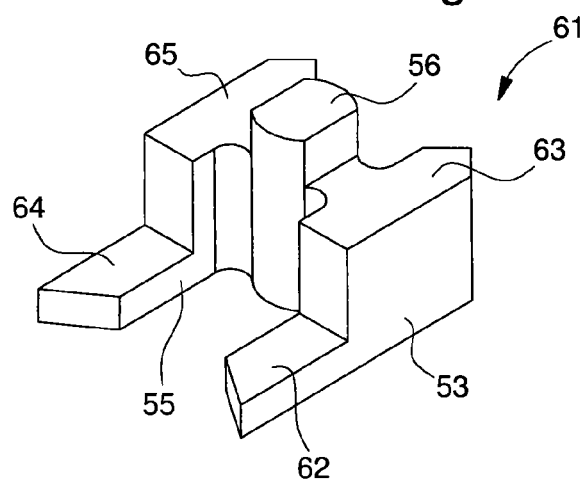
Figure 13:
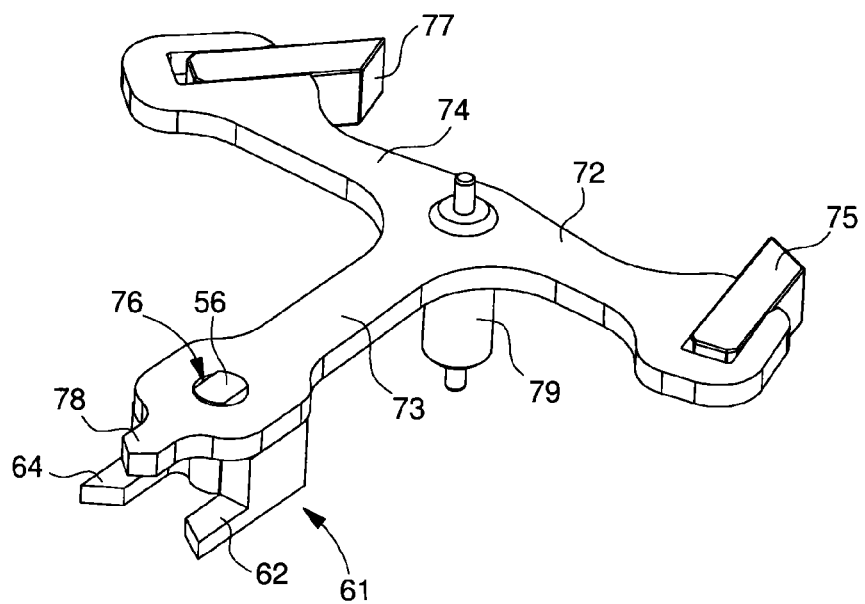

A second variant illustrated in FIGS. 11 to 13 shows a metal part 51 obtained in step 7 of method 1. Part 51 generally takes the form of an H-shaped part having two parallel portions 53, 55 connected to each other by a cross portion 57. As visible in FIG. 11, the cross portion 57 includes a central part 56 whose section is more flared than the rest of the portion.

At the end of step 11 of method 1, it is thus possible to obtain a micromechanical component in the form of a fork 61 illustrated in FIG. 12, which is in a single-piece and includes at least two distinct functional levels which may or may not be coated with a layer 13. Thus, metal part 51 has been machined on the two parallel portions 53, 55 to two depths, i.e. forming three functional levels, and to a single depth on the non-flared portion of the cross portion 57.

In the example of FIG. 12, fork 61 thus only includes the whole of parallel portions 53, 55 on the lower level, forming two horns 62, 64. An intermediate level only partially includes parallel portions 53, 55 and the non-flared part of cross portion 57, forming shoulders 63 and 65. Finally, only central part 56 of cross portion 57 of metal part 51 is preserved, forming, only in the top level, a stud.

As visible in FIG. 13, fork 61 can then be mounted, by driving central stud part 56 into the hole 76 in a lever 73 to form a pallets 71. Lever 73 can be obtained by a LIGA process with an integral dart 78. In addition to fork 61, lever 73 may be provided with pallet stones 75, 77 on the arms 72, 74 thereof and a pallet-staff 79. Evidently, advantageously according to the invention, all or part of pallets 71 may also be obtained using method 1 of the invention. By way of example, pallet stones 75, 77, lever 73, dart 78 and hole 76 could be in a single-piece and obtained using method 1 of the invention.

Figure 14:
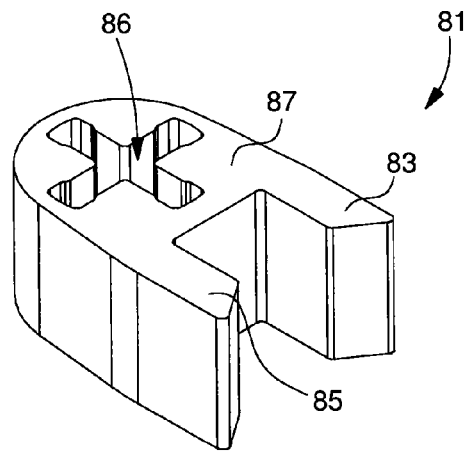
FIGS. 14 to 16 are diagrams of a metal part which is electroformed then machined using a method according to a third variant of the invention, and then assembled.
Figure 15:
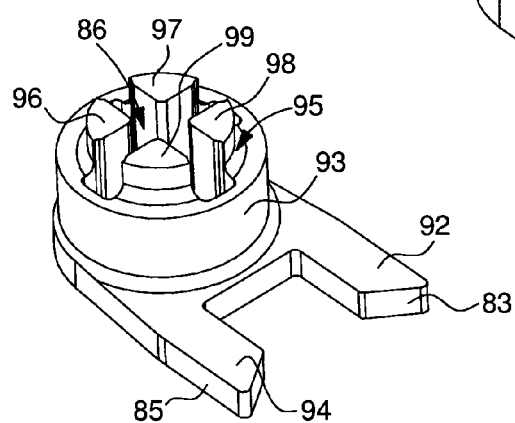
Figure 16:
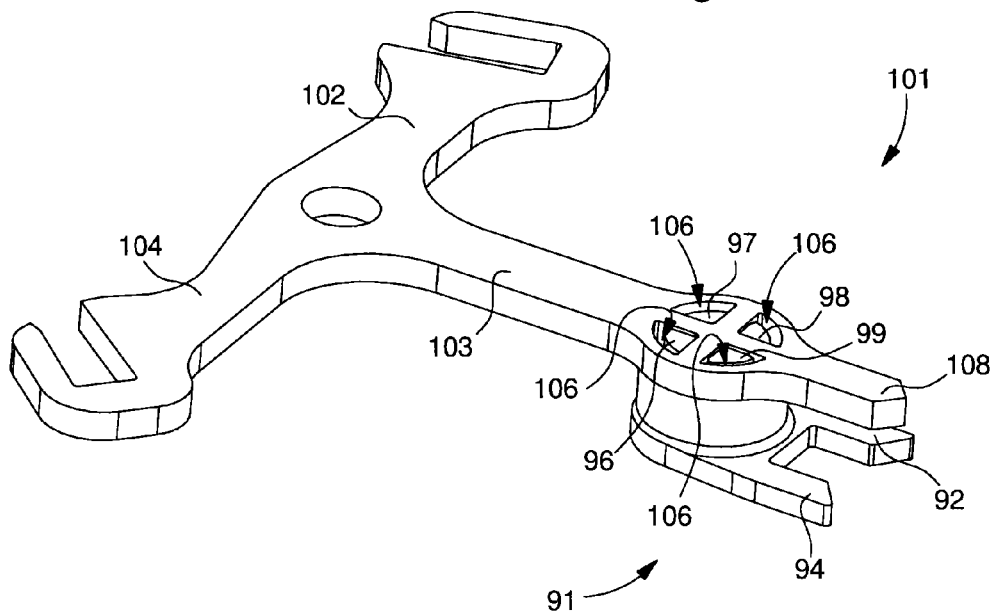

A third variant illustrated in FIGS. 14 to 16 shows a metal part 81 obtained in step 7 of method 1. Part 81 generally takes the form of a U-shaped part having two parallel portions 83, 85 connected to each other by a base 87. As visible in FIG. 14, the base is thicker than parallel portions 83, 85 to form a substantially cross-shaped opening 86.

At the end of step 11 of method 1, it is thus possible to obtain a micromechanical component in the form of a fork 91 illustrated in FIG. 15, which is in a single-piece and includes at least two distinct functional levels which may or may not be coated with a layer 13. Thus, metal part 81 has been machined on two parallel portions 83, 85 to a single depth and to two depths on base 87, i.e. forming three functional levels.

In the example of FIG. 15, fork 91 thus only includes the whole of parallel portions 83, 85 on the lower level, forming two horns 92, 94. An intermediate layer only partially includes base 87, forming a cylinder 93 contracting via a shoulder 95 to form the top level. Finally, the contraction is used to release opening 86 in the upper level and to form four studs 96, 97, 98, 99.

As visible in FIG. 15, fork 91 can then be mounted, by driving studs 96, 97, 98, 99 into the holes 106 in a lever 103 to form a pallets 101. Lever 103 can be obtained by a LIGA process with an integral dart 108. In addition to fork 91, as in the second variant, lever 103 may also be provided with pallet stones on the arms 102, 104 thereof and a pallet-staff. Evidently, advantageously according to the invention, all or part of pallets 101 may also be obtained using method 1 of the invention. By way of example, the pallet stones, lever 103, dart 108 and hole 106 could be in a single-piece and obtained using method 1 of the invention.

Consequently, advantageously according to the invention, the external dimensions 22, 24, 53, 55, 56, 83, 85 and possibly internal dimensions 26, 86 retain the high precision resulting from the LIGA process and the remainder of single-piece micromechanical component 31, 41, 61, 91 enjoys machining precision to conserve fabricating costs. There is therefore obtained a single-piece micromechanical component 31, 41, 61, 91 including at least two distinct functional levels which is much easier to fabricate yet maintains the very high precision external portions 22, 24, 53, 55, 56, 83, 85 and possibly internal portions 26, 86.

Of course, the present invention is not limited to the illustrated example but is capable of various variants and alterations that will appear to those skilled in the art. In particular, within the field of horology, micromechanical components 31, 41, 61, 91 are in no way limited to all or part of a wheel set or pallets. Other timepiece parts may be envisaged, notably bridges, plates or balances.

Further, as explained above, it is also possible to envisage applying the present invention to fields other than horology, such as aeronautics or the automobile industry.

The invention claimed is:

1. A method of manufacturing a single-piece micromechanical component including at least two distinct functional levels, wherein it includes the following steps:
   a) forming a silicon substrate whose top surface is electrically conductive;
   b) structuring a mould from a photosensitive resin in order to form cavities whose base is formed by said electrically conductive top surface;
   c) filling the cavities of the mould by galvanoplasty to form a metal part;
   d) selectively machining one portion of the metal part to form a single-piece micromechanical component having at least two distinct functional levels;
   e) releasing the micromechanical component from the substrate and the photosensitive resin.

2. The method according to claim 1, wherein the top surface is rendered electrically conductive by doping the silicon substrate and/or by the deposition of an electrically conductive layer on the silicon substrate.

3. The method according to claim 1, wherein the silicon substrate has a thickness of between 0.3 and 1 mm.

4. The method according to claim 1, wherein step b) includes the following phases:
   f) depositing a layer of photosensitive resin on the electrically conductive top surface of the substrate;

g) selectively illuminating one part of the photosensitive resin;

h) developing the photosensitive resin to structure the mould.

5. The method according to claim 1, wherein the metal part is formed from a nickel phosphorus base (NiP, NiP12).

6. The method according to claim 1, wherein between step c) and step d), the method includes the following step:

i) levelling the mould and the metal part by lapping.

7. The method according to claim 1, wherein, in step e), the method includes the following phases:

j) removing the photosensitive resin;

k) removing the substrate;

and wherein between phase j) and phase k), the method further includes the following phase:

l) depositing a coating on the micromechanical component substrate assembly.

8. The method according to claim 7, wherein phase l) is achieved by physical or chemical vapour deposition.

9. The method according to claim 7, wherein phase l) is achieved by galvanoplasty.

10. The method according to claim 1, wherein several micromechanical components are formed on the same substrate.

11. A timepiece wherein the timepiece includes a single-piece micromechanical part having at least two distinct functional levels according to claim 1.

* * * * *